(12) United States Patent
Endo et al.

(10) Patent No.: US 7,700,268 B2
(45) Date of Patent: Apr. 20, 2010

(54) EXPOSURE SYSTEM AND PATTERN FORMATION METHOD USING THE SAME

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 1021 days.

(21) Appl. No.: 11/010,422

(22) Filed: Dec. 14, 2004

(65) Prior Publication Data

US 2005/0136361 A1 Jun. 23, 2005

(30) Foreign Application Priority Data

Dec. 17, 2003 (JP) .............................. 2003-419444

(51) Int. Cl.
*G03F 7/26* (2006.01)
(52) U.S. Cl. .................................... 430/311
(58) Field of Classification Search ................. 430/322, 430/311
See application file for complete search history.

(56) References Cited

U.S. PATENT DOCUMENTS

| | | | |
|---|---|---|---|
| 6,867,844 B2 * | 3/2005 | Vogel et al. | 355/30 |
| 6,980,277 B2 | 12/2005 | Sewell | |
| 7,193,232 B2 * | 3/2007 | Lof et al. | 250/548 |
| 2004/0075895 A1 * | 4/2004 | Lin | 359/380 |
| 2004/0211920 A1 | 10/2004 | Maria Derksen et al. | |
| 2004/0265747 A1 * | 12/2004 | Medeiros et al. | 430/313 |
| 2006/0072088 A1 * | 4/2006 | Lipson et al. | 355/53 |

FOREIGN PATENT DOCUMENTS

| | | |
|---|---|---|
| JP | 06-168866 | 6/1994 |
| JP | 07-220990 | 8/1995 |
| JP | 08-316125 | 11/1996 |
| JP | 10-303114 | 11/1998 |
| JP | 2005-123305 | 5/2005 |
| JP | 2005-136404 | 5/2005 |
| JP | 2006-523031 | 10/2006 |
| WO | WO99/49504 | 9/1999 |
| WO | WO 99/49504 | 9/1999 |
| WO | WO 2004/093130 A2 | 10/2004 |

OTHER PUBLICATIONS

Switkes, M., et al. "Immersion lithography at 157nm." J. Vac. Sci. Technol., B19(6), pp. 2353-2356 (2001).
Japanese Notice of Reasons for Rejection, and English translation thereof, issued in Patent Application No. JP 2003-419444 dated on Jun. 10, 2008.
Japanese Office Action, with English translation, issued in Japanese Patent Application No. JP 2003-419444 dated Jan. 20, 2009.
Japanese Decision to Dismiss the Amendment, with English translation, issued in Japanese Patent Application No. JP 2003-419444 dated Jan. 20, 2009.

* cited by examiner

*Primary Examiner*—Kathleen Duda
*Assistant Examiner*—Brittany Raymond
(74) *Attorney, Agent, or Firm*—McDermott Will & Emery LLP

(57) ABSTRACT

An exposure system includes a liquid supply section for supplying an immersion liquid onto a resist film formed on a substrate; and an exposure section for irradiating the resist film with exposing light through a mask with the immersion liquid provided on the resist film. The liquid supply section includes an immersion liquid tank for circulating the immersion liquid during exposure.

6 Claims, 7 Drawing Sheets

EXPOSURE SYSTEM AND PATTERN FORMATION METHOD USING THE SAME

CROSS-REFERENCE TO RELATED APPLICATIONS

This application claims priority under 35 U.S.C. §119 on Patent Application No. 2003-419444 filed in Japan on Dec. 17, 2003, the entire contents of which are hereby incorporated by reference.

BACKGROUND OF THE INVENTION

The present invention relates to an exposure system for use in fabrication process and the like for semiconductor devices and a pattern formation method using the exposure system.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (see, for example, M. Switkes and M. Rothschild, "Immersion lithography at 157 nm", J. Vac. Sci. Technol., Vol. B19, p. 2353 (2001)).

In the immersion lithography, a region in an exposure system sandwiched between a projection lens and a resist film formed on a wafer is filled with a liquid having a refractive index n (wherein n>1), and therefore, the NA (numerical aperture) of the exposure system has a value n·NA. As a result, the resolution of the resist film can be improved.

Now, a conventional pattern formation method employing the immersion lithography will be described with reference to FIGS. 7A through 7D.

First, a positive chemically amplified resist material having the following composition is prepared:

| | |
|---|---|
| Base polymer:<br>poly((norbornene-5-methylene-t-butylcarboxylate)<br>(50 mol %)-<br>(maleic anhydride) (50 mol %)) | 2 g |
| Acid generator:<br>triphenylsulfonium triflate | 0.06 g |
| Solvent: propylene<br>glycol monomethyl<br>ether acetate | 20 g |

Next, as shown in FIG. 7A, the aforementioned chemically amplified resist material is applied on a substrate 1 so as to form a resist film 2 with a thickness of 0.35 μm.

Then, as shown in FIG. 7B, with an immersion liquid (water) 3 provided on the resist film 2, pattern exposure is carried out by irradiating the resist film 2 with exposing light 4 of ArF excimer laser with NA of 0.68 through a mask 5.

After the pattern exposure, as shown in FIG. 7C, the resist film 2 is baked with a hot plate at a temperature of 110° C. for 60 seconds, and the resultant resist film is developed with a 2.38 wt % tetramethylammonium hydroxide solution (alkaline developer). In this manner, a resist pattern 2a made of an unexposed portion of the resist film 2 and having a line width of 0.09 μm is formed as shown in FIG. 7D.

As shown in FIG. 7D, however, the resist pattern 2a formed by the conventional pattern formation method employing the immersion lithography is in a defective shape.

SUMMARY OF THE INVENTION

The present inventors have made various examinations to find the reason why the resist pattern formed by the conventional immersion lithography is in a defective shape, resulting in reaching the following conclusion: The ArF excimer laser used in the pattern exposure has a wavelength as short as 193 nm and has large light energy. Therefore, when the resist film 2 is subjected to the pattern exposure through the immersion liquid 3, an irradiated portion of the immersion liquid 3 irradiated with the exposing light is increased in its temperature because of the applied light energy. At this point, there is a large difference in the amount of applied light energy between the irradiated portion of the immersion liquid and a masked portion thereof, which causes variation in the temperature distribution of the immersion liquid 3. When the temperature distribution of the immersion liquid 3 is thus varied, the value of the refractive index n of the immersion liquid 3 is also locally varied. As a result, variation is caused in the refractive index n of the immersion liquid 3. In other words, the value n·NA of the numerical aperture employed in the pattern exposure is varied within the exposure region, and therefore, focus failure occurs in the resist film 2 during the pattern exposure.

When a resist pattern in such a defective shape is used for etching a target film, the resultant pattern of the target film is also in a defective shape, which disadvantageously lowers the productivity and the yield in the fabrication process for semiconductor devices.

In consideration of the aforementioned conventional problem, an object of the invention is forming a resist pattern in a good shape by the immersion lithography.

On the basis of the results of the aforementioned examinations, the present inventors have found that the variation in the temperature distribution caused in an immersion liquid by exposing light can be prevented by placing the immersion liquid in a flow state during the exposure. The present invention was devised on the basis of the finding, and according to the invention, the variation in the temperature distribution caused in the immersion liquid is avoided by allowing the immersion liquid to flow during the exposure. Specifically, the present invention is practiced as follows:

The first exposure system of this invention includes a liquid supply section for supplying an immersion liquid onto a resist film formed on a substrate; an exposure section for irradiating the resist film with exposing light through a mask with the immersion liquid provided on the resist film; and a liquid circulating unit connected to the liquid supply section, and the immersion liquid is circulated from said liquid supply section to the exposure section during exposure.

In the first exposure system, since the immersion liquid is circulated during the pattern exposure by the liquid supply section for supplying the immersion liquid onto the resist film, the variation in the temperature distribution otherwise caused during the exposure by the exposing light between a portion irradiated with the exposing light and a portion masked from the exposing light of the immersion liquid can be avoided, so as to make the temperature of the immersion liquid uniform. Specifically, when the temperature of the immersion liquid is changed by 1° C., the refractive index n is changed by approximately $-1.0 \times 10^{-4}$ through $-1.0 \times 10^{-3}$.

The layout of interconnects has recently become more and more refined and complicated, and hole diameters and interconnect widths are finely or variously set to, for example, 10 through 200 nm. When a resist pattern is formed for forming a hole or an interconnect, the resolution of the resist pattern is affected by slight change of the refractive index caused by the temperature change of 1° C. As a result, it is difficult to precisely form a desired pattern. Therefore, when the immersion liquid used for the immersion lithography is stirred during the pattern exposure, the variation in the temperature of the immersion liquid can be reduced. For example, when the pooled immersion liquid is stirred at a rate of approximately 100 rpm through 1000 rpm during the pattern exposure, the influence of the temperature of the immersion liquid changed owing to energy applied by the exposing light can be reduced. The stirring rate is set depending upon the exposure, and for example, in forming resist patterns for respective layers of interconnects, a high stirring rate may be employed when the pattern density is relatively high and a low stirring rate may be employed when the pattern density is relatively low. Since the variation in the refractive index of the immersion liquid can be avoided by thus making the temperature of the immersion liquid uniform, abnormal exposure such as focus failure can be prevented. As a result, a resist pattern can be formed in a good shape by the immersion lithography.

The second exposure system of this invention includes a liquid supply section for supplying an immersion liquid onto a resist film formed on a substrate; an exposure section for irradiating the resist film with exposing light through a mask with the immersion liquid provided on the resist film; and a liquid stirring unit placed on the exposure section, and the immersion liquid is stirred at the exposure section during exposure.

In the second exposure system, since the immersion liquid is stirred during the exposure by the liquid stirring means of the liquid supply section for supplying the immersion liquid onto the resist film, the variation in the temperature distribution otherwise caused in the immersion liquid during the exposure between a portion irradiated with the exposing light and a portion masked from the exposing light of the immersion liquid can be avoided, and hence, the temperature of the immersion liquid can be made uniform. Therefore, since the variation in the refractive index of the immersion liquid can be avoided, abnormal exposure such as focus failure can be prevented. As a result, a resist pattern can be formed in a good shape by the immersion lithography.

In the first exposure system, the liquid supply section preferably includes liquid stirring means for stirring the immersion liquid.

In the first or second exposure system, the immersion liquid may be water or perfluoropolyether.

The pattern formation method of this invention includes the steps of forming a resist film on a substrate; performing pattern exposure by selectively irradiating the resist film with exposing light with an immersion liquid provided on the resist film; and developing the resist film after the pattern exposure, and the immersion liquid is allowed to flow during the pattern exposure in the step of performing pattern exposure.

In the pattern formation method of the invention, the immersion liquid is allowed to flow during the pattern exposure in the step of performing pattern exposure, and therefore, the variation in the temperature distribution otherwise caused by the exposing light during the pattern exposure between a portion irradiated with the exposing light and a portion masked from the exposing light of the immersion liquid can be avoided, so as to make the temperature of the immersion liquid uniform. Since the variation in the refractive index of the immersion liquid can be avoided by thus making the temperature of the immersion liquid uniform, abnormal exposure such as focus failure can be prevented. As a result, a resist pattern can be formed in a good shape by the immersion lithography.

In the pattern formation method of the invention, the immersion liquid is preferably circulated during the pattern exposure in the step of performing pattern exposure.

In the pattern formation method of the invention, the immersion liquid is preferably stirred during the pattern exposure in the step of performing pattern exposure.

In the pattern formation method of the invention, the immersion liquid is preferably discharged during the pattern exposure in the step of performing pattern exposure.

In the pattern formation method of the invention, a fresh immersion liquid is preferably supplied onto the resist film during the pattern exposure in the step of performing pattern exposure.

In the pattern formation method of the invention, the immersion liquid may be water or perfluoropolyether.

In the exposure system or the pattern formation method of the invention, the exposing light may be KrF excimer laser, ArF excimer laser, $F_2$ laser, $Kr_2$ laser, ArKr laser or $Ar_2$ laser.

More specifically, from the viewpoint of light transmittance, when the exposure is performed with UV using g-line, i-line or the like of a mercury lamp or with extreme UV using KrF excimer laser, ArF excimer laser or the like, water may be used as the immersion liquid. Alternatively, when the exposure is performed with vacuum UV using $F_2$ laser or the like, perfluoropolyether may be used as the immersion liquid. It is noted that perfluoropolyether may be used in the exposure with UV using g-line, i-line or the like or extreme UV using KrF excimer laser, ArF excimer laser or the like.

BRIEF DESCRIPTION OF THE DRAWINGS

FIG. 1A is a cross-sectional thereof and FIG. 1B is a plan view thereof;

DETAILED DESCRIPTION OF THE INVENTION

Embodiment 1

Embodiment 1 of the invention will now be described with reference to the accompanying drawings.

Figure 1A:
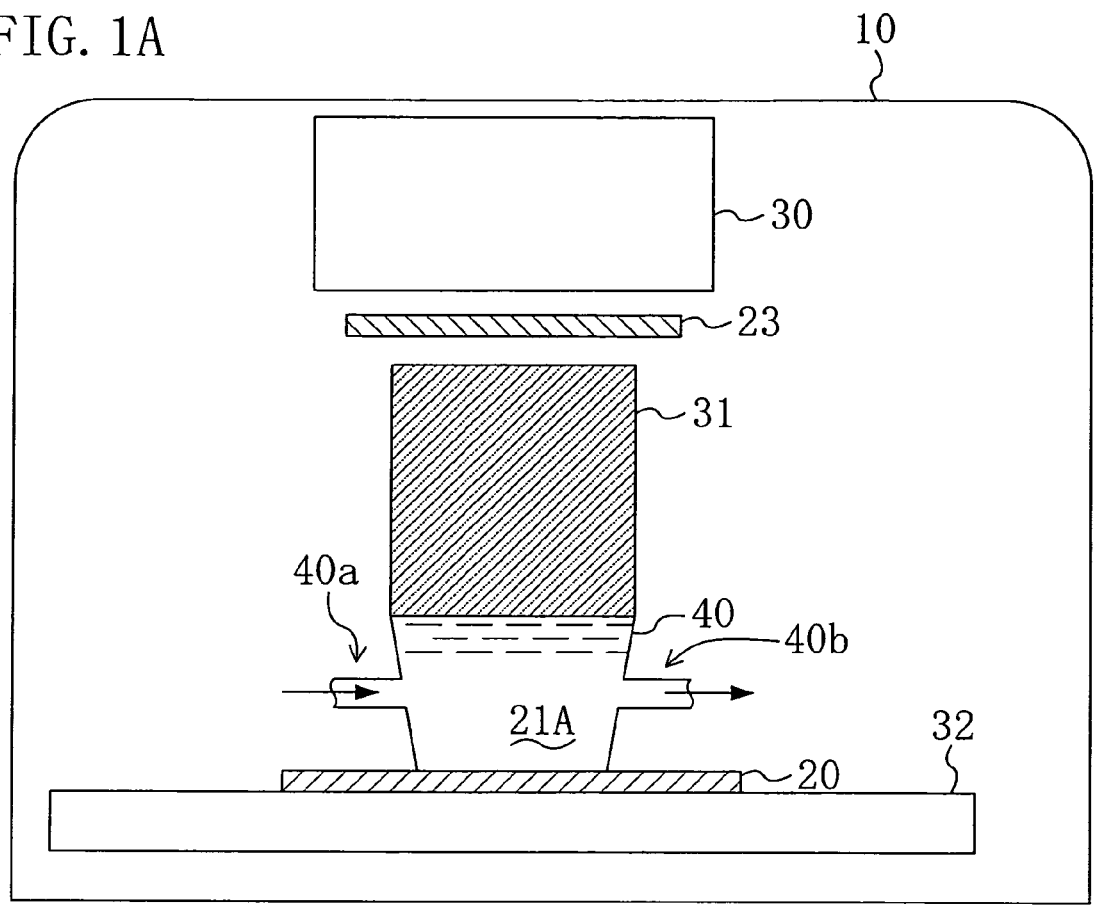
FIGS. 1A and 1B are diagrams of a principal portion of an exposure system according to Embodiment 1 of the invention, and more specifically.
Figure 1B:
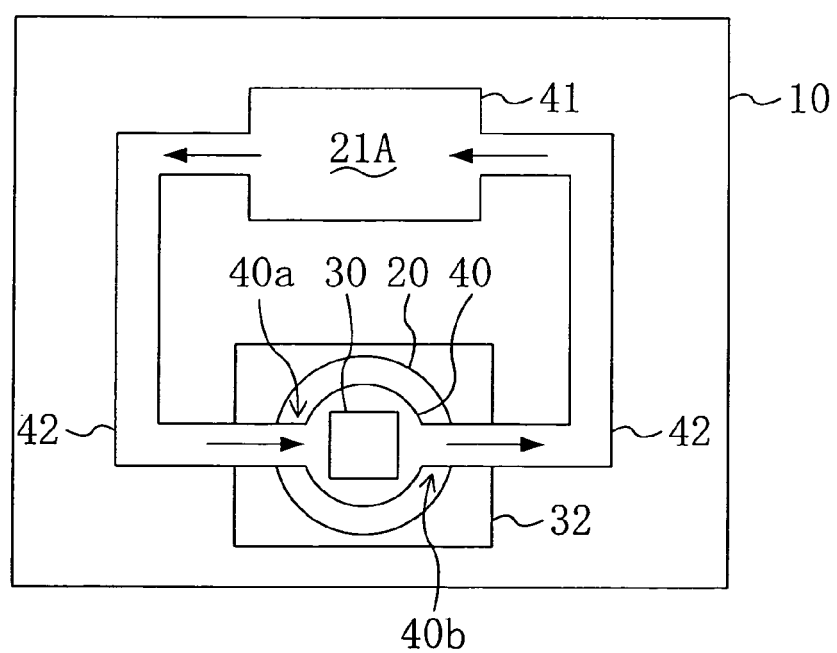

FIGS. 1A and 1B show a principal portion of an exposure system used for realizing a pattern formation method employing immersion lithography according to Embodiment 1 of the invention, and more specifically, FIG. 1A is a schematic cross-sectional view thereof and FIG. 1B is a schematic plan view thereof.

As shown in FIG. 1A, the exposure system of Embodiment 1 includes an illumination optical system 30 that is provided within a chamber 10 and works as a light source for exposing a design pattern on a resist film (not shown) applied on a wafer 20, and a bucket type liquid pooling section 40 that supplies an immersion liquid 21A, used for increasing the numerical aperture of exposing light, onto the wafer 20 during the exposure and has an inlet 40a and an outlet 40b.

Below the illumination optical system 30, a projection lens 31 for projecting the exposing light, which is emitted by the illumination optical system 30 and enters through a mask (reticle) 23 having the design pattern to be transferred onto the resist film, onto the resist film through the immersion liquid 21A, and a wafer stage 32 for holding the wafer 20 are provided. The projection lens 31 is held, during the exposure, so as to be in contact with the liquid surface of the immersion liquid 21A supplied onto the resist film of the wafer 20.

Also, as shown in FIG. 1B, within the chamber 10, an immersion liquid tank 41 having a circulation mechanism for circulating the immersion liquid 21A to/from the liquid pooling section 40 is provided, and a circulating pipe 42 for allowing the immersion liquid 21A to pass therethrough is provided between the immersion liquid tank 41 and the liquid pooling section 40.

Now, a pattern formation method using the exposure system shown in FIGS. 1A and 1B will be described with reference to FIGS. 2A through 2D.

First, a positive chemically amplified resist material having the following composition is prepared:

| | |
|---|---|
| Base polymer: poly((norbornene-5-methylene-t-butylcarboxylate) (50 mol %)-(maleic anhydride) (50 mol %)) | 2 g |
| Acid generator: triphenylsulfonium triflate | 0.06 g |
| Solvent: propylene glycol monomethyl ether acetate | 20 g |

Figure 2A:
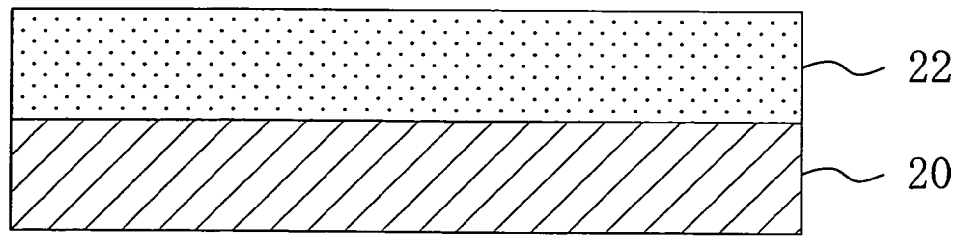
FIGS. 2A, 2B, 2C and 2D are cross-sectional views for showing procedures in a pattern formation method using the exposure system of Embodiment 1.

Next, as shown in FIG. 2A, the aforementioned chemically amplified resist material is applied on a wafer 20 so as to form a resist film 22 with a thickness of 0.35 µm.

Figure 2B:
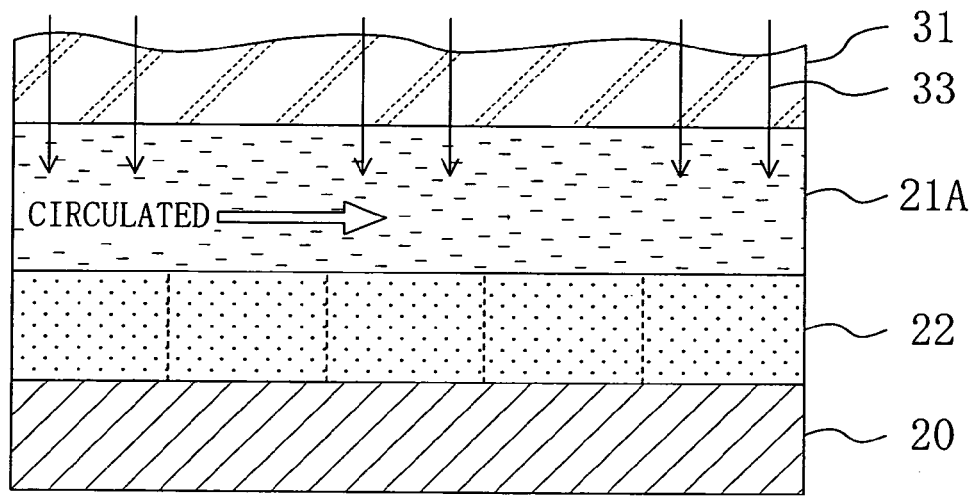

Then, as shown in FIG. 2B, with an immersion liquid 21A of water filled in the liquid pooling section 40 between the resist film 22 and a projection lens 31, pattern exposure is carried out by irradiating the resist film 22 with exposing light 33 of ArF excimer laser with NA of 0.68 through a mask 23. At this point, the immersion liquid 21A is circulated between the liquid pooling section 40 and the immersion liquid tank 41 as shown in FIG. 1B also during the pattern exposure performed with the immersion liquid 21A provided on the wafer 20.

Figure 2C:
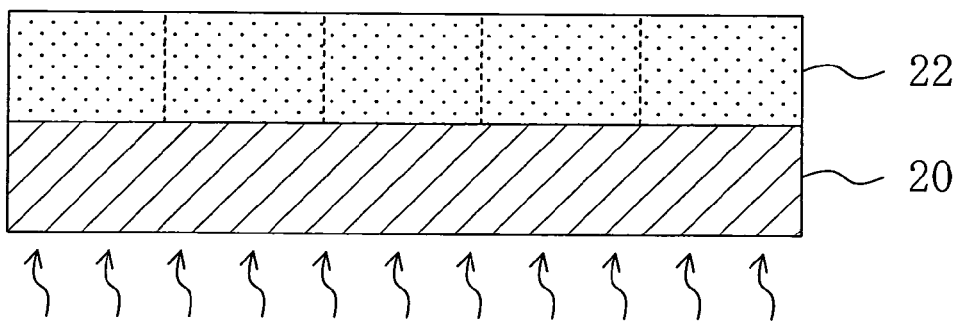
Figure 2D:
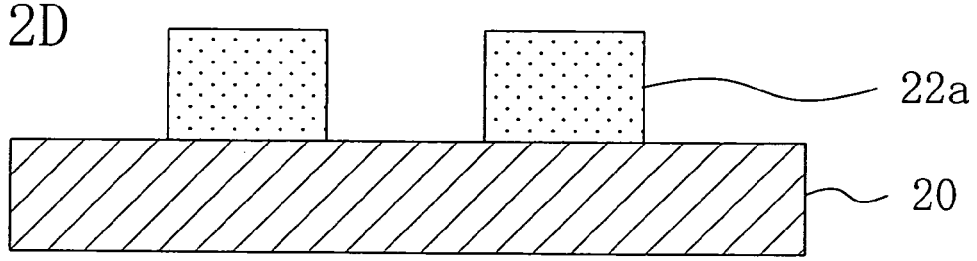

After the pattern exposure, as shown in FIG. 2C, the resist film 22 is baked with a hot plate at a temperature of 100° C. for 60 seconds, and the resultant resist film is developed with a 2.38 wt % tetramethylammonium hydroxide solution (alkaline developer). In this manner, a resist pattern 22a made of an unexposed portion of the resist film 22 and having a line width of 0.09 µm can be formed in a good shape as shown in FIG. 2D.

In this manner, according to the pattern formation method of Embodiment 1, since the immersion liquid 21A provided on the resist film 22 is circulated to be placed in a flow state during the pattern exposure, variation in the temperature distribution otherwise caused between a portion irradiated with the exposing light 33 and a portion masked from the exposing light of the immersion liquid 21A can be avoided, and therefore, the temperature of the immersion liquid 21A can be made uniform. Owing to the uniform temperature of the immersion liquid 21A, variation in the refractive index of the immersion liquid 21A can be avoided, and hence, abnormal exposure such as focus failure can be prevented. As a result, the resist pattern 22a made of the resist film 22 can be formed in a good shape.

Embodiment 2

Embodiment 2 of the invention will now be described with reference to the accompanying drawings.

Figure 3:
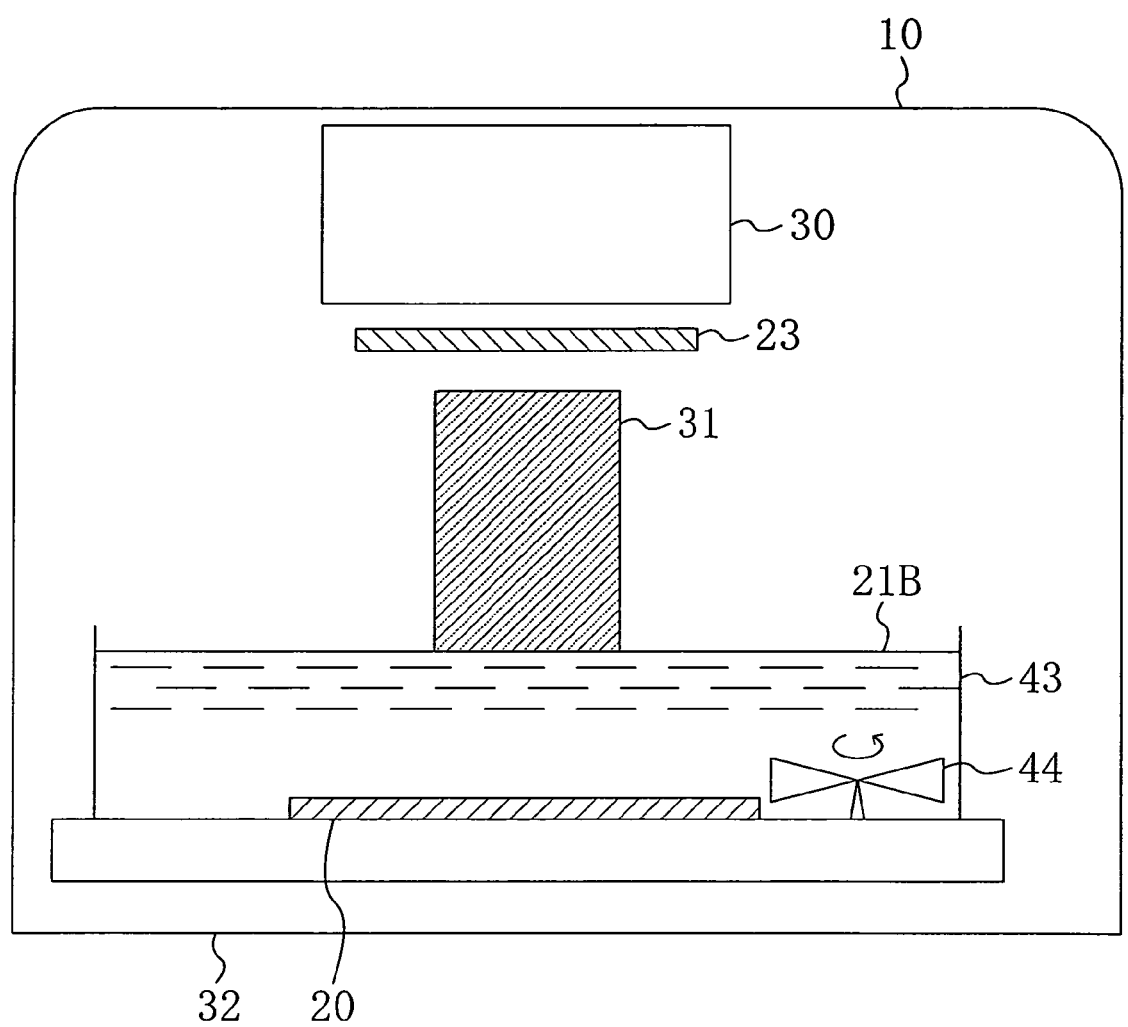
FIG. 3 is a cross-sectional view of a principal portion of an exposure system according to Embodiment 2 of the invention.

FIG. 3 shows a principal portion of an exposure system used for realizing a pattern formation method employing the immersion lithography according to Embodiment 2 of the invention. In FIG. 3, like reference numerals are used to refer to like elements shown in FIG. 1A so as to omit the description.

As shown in FIG. 3, the exposure system of Embodiment 2 includes a liquid pooling section 43 in the shape of a dip type vessel, and on the bottom of the liquid pooling section 43, a stirrer 44 for stirring an immersion liquid 21B pooled therein is provided in a position not disturbing exposure.

Now, a pattern formation method using the exposure system shown in FIG. 3 will be described with reference to FIGS. 4A through 4D.

First, a positive chemically amplified resist material having the following composition is prepared:

| | |
|---|---|
| Base polymer: poly((norbornene-5-methylene-t-butylcarboxylate) (50 mol %)- (maleic anhydride) (50 mol %)) | 2 g |
| Acid generator: triphenylsulfonium triflate | 0.06 g |
| Solvent: propylene glycol monomethyl ether acetate | 20 g |

Figure 4A:
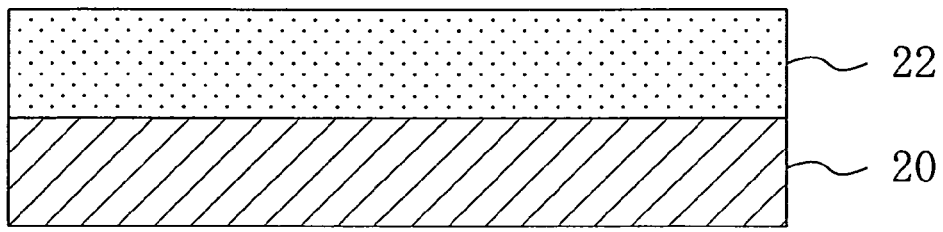
FIGS. 4A, 4B, 4C and 4D are cross-sectional views for showing procedures in a pattern formation method using the exposure system of Embodiment 2.

Next, as shown in FIG. 4A, the aforementioned chemically amplified resist material is applied on a wafer 20 so as to form a resist film 22 with a thickness of 0.35 µm.

Figure 4B:
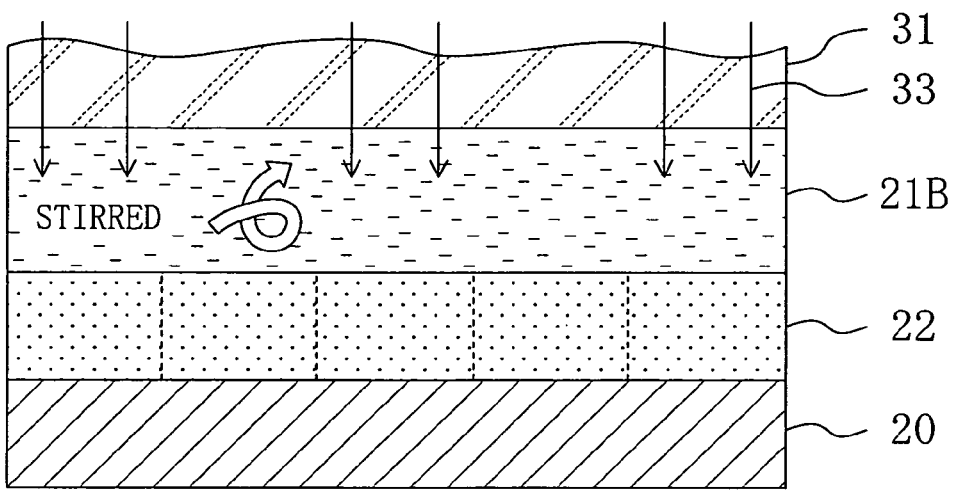

Then, as shown in FIG. 4B, with an immersion liquid 21B of water filled in the liquid pooling section 43 between the resist film 22 and a projection lens 31, pattern exposure is carried out by irradiating the resist film 22 with exposing light 33 of ArF excimer laser with NA of 0.68 through a mask 23. At this point, the immersion liquid 21B is gently stirred without foaming the immersion liquid 21B by the stirrer 44 provided in the liquid pooling section 43.

Figure 4C:
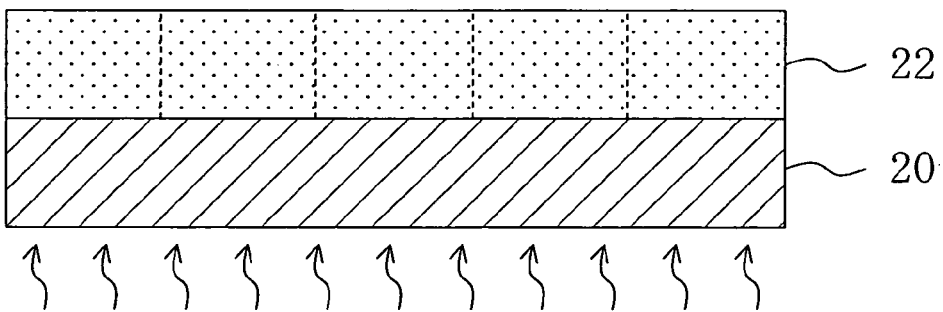
Figure 4D:
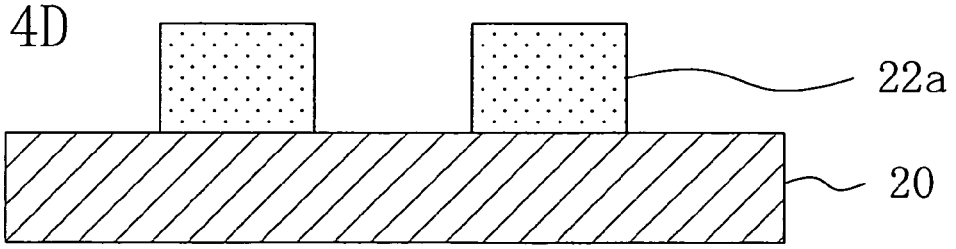

After the pattern exposure, as shown in FIG. 4C, the resist film 22 is baked with a hot plate at a temperature of 100° C. for 60 seconds, and the resultant resist film is developed with a 2.38 wt % tetramethylammonium hydroxide solution (alkaline developer). In this manner, a resist pattern 22a made of an unexposed portion of the resist film 22 and having a line width of 0.09 µm can be formed in a good shape as shown in FIG. 4D.

In this manner, according to the pattern formation method of Embodiment 2, since the immersion liquid 21B provided on the resist film 22 is gently stirred to be placed in a flow state during the pattern exposure, variation in the temperature distribution otherwise caused between a portion irradiated with the exposing light 33 and a portion masked from the exposing light of the immersion liquid 21B can be avoided, and therefore, the temperature of the immersion liquid 21B can be made uniform. Owing to the uniform temperature of the immersion liquid 21B, variation in the refractive index of the immersion liquid 21B can be avoided, and hence, abnormal exposure such as focus failure can be prevented. As a result, the resist pattern 22a made of the resist film 22 can be formed in a good shape.

Embodiment 3

Embodiment 3 of the invention will now be described with reference to the accompanying drawings.

Figure 5:
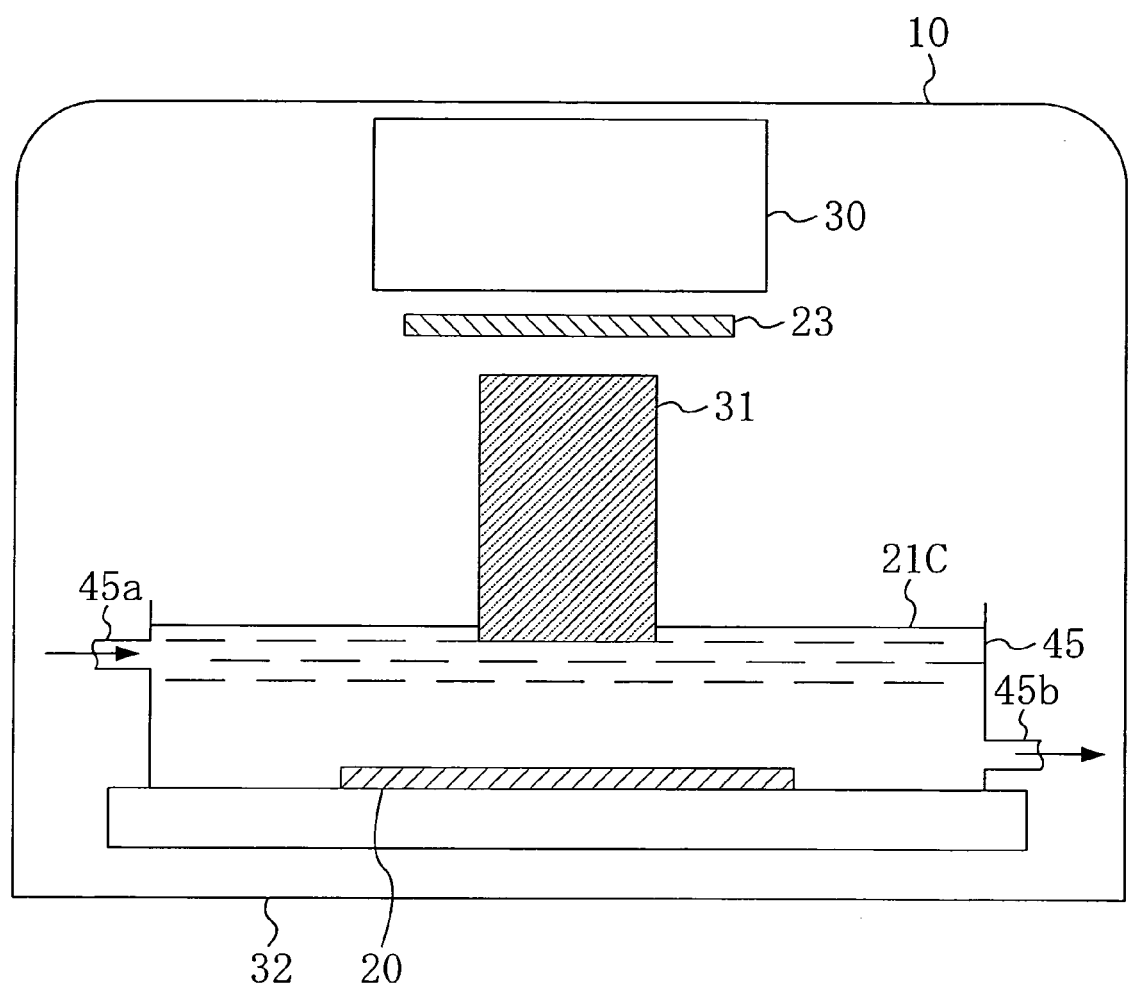
FIG. 5 is a cross-sectional view of a principal portion of an exposure system according to Embodiment 3 of the invention.

FIG. 5 shows a principal portion of an exposure system used for realizing a pattern formation method employing the immersion lithography according to Embodiment 3 of the invention. In FIG. 5, like reference numerals are used to refer to like elements shown in FIG. 3 so as to omit the description.

As shown in FIG. 5, the exposure system of Embodiment 3 includes a liquid pooling section 45 in the shape of a dip type vessel, and an inlet 45a for allowing an immersion liquid 21C to flow into the liquid pooling section 45 and an outlet 45b for discharging the immersion liquid 21C having flown through the inlet 45a are provided on the side portions of the liquid pooling section 45.

Now, a pattern formation method using the exposure system shown in FIG. 5 will be described with reference to FIGS. 6A through 6D.

First, a positive chemically amplified resist material having the following composition is prepared:

| | |
|---|---|
| Base polymer: poly((norbornene-5-methylene-t-butylcarboxylate) (50 mol %)-(maleic anhydride) (50 mol %)) | 2 g |
| Acid generator: triphenylsulfonium triflate | 0.06 g |
| Solvent: propylene glycol monomethyl ether acetate | 20 g |

Figure 6A:
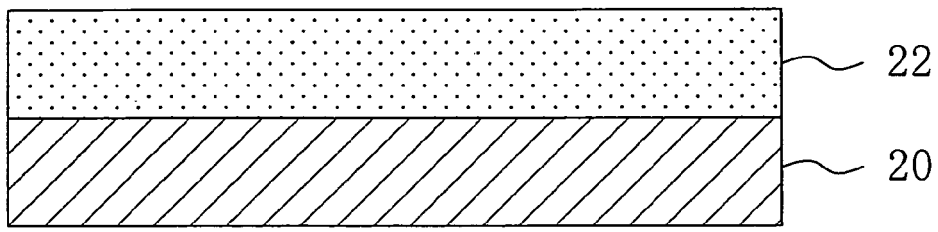
FIGS. 6A, 6B, 6C and 6D are cross-sectional views for showing procedures in a pattern formation method using the exposure system of Embodiment 3.

Next, as shown in FIG. 6A, the aforementioned chemically amplified resist material is applied on a wafer 20 so as to form a resist film 22 with a thickness of 0.35 μm.

Figure 6B:
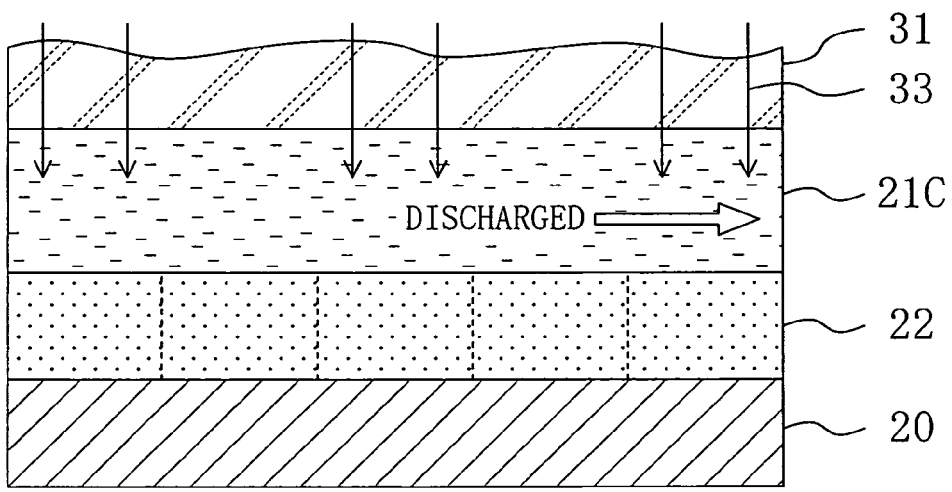

Then, as shown in FIG. 6B, an immersion liquid 21C of water is allowed to flow through the inlet 45a of the liquid pooling section 45 into the liquid pooling section 45 provided between the resist film 22 and a projection lens 31 in the amount larger than a given amount before pattern exposure. Subsequently, immediately before starting the pattern exposure or substantially at the same time as the start of the pattern exposure, the immersion liquid 21C is started to be discharged through the outlet 45b of the liquid pooling section 45. While discharging the immersion liquid 21C, the pattern exposure is carried out by irradiating the resist film 22 with exposing light 33 of ArF excimer laser with NA of 0.68 through a mask 23.

Figure 6C:
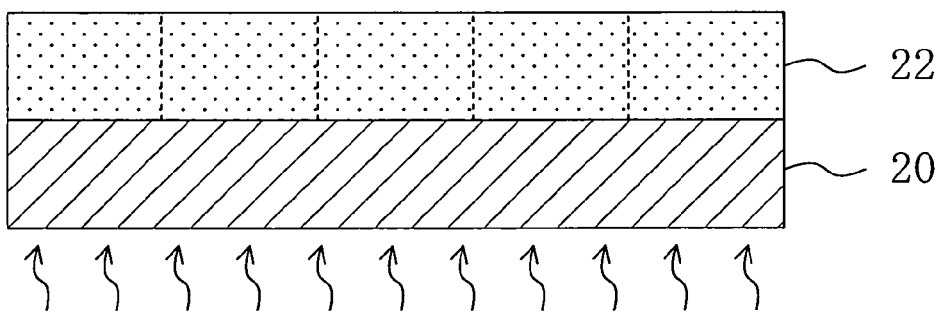
Figure 6D:
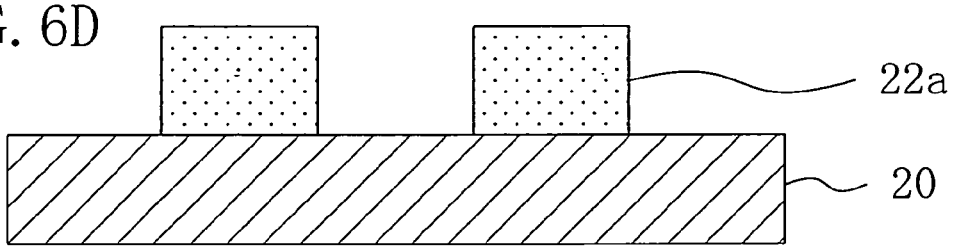
Figure 7A:
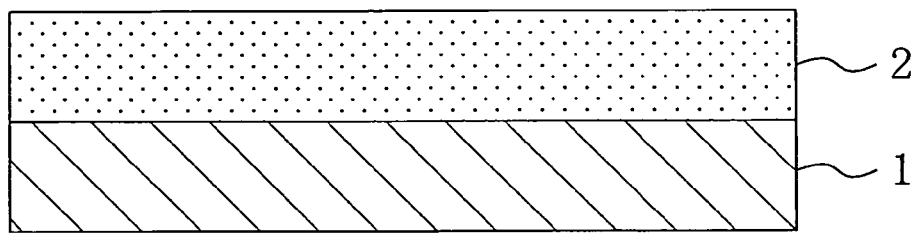
FIGS. 7A, 7B, 7C and 7D are cross-sectional views for showing procedures in a conventional pattern formation method.
Figure 7B:
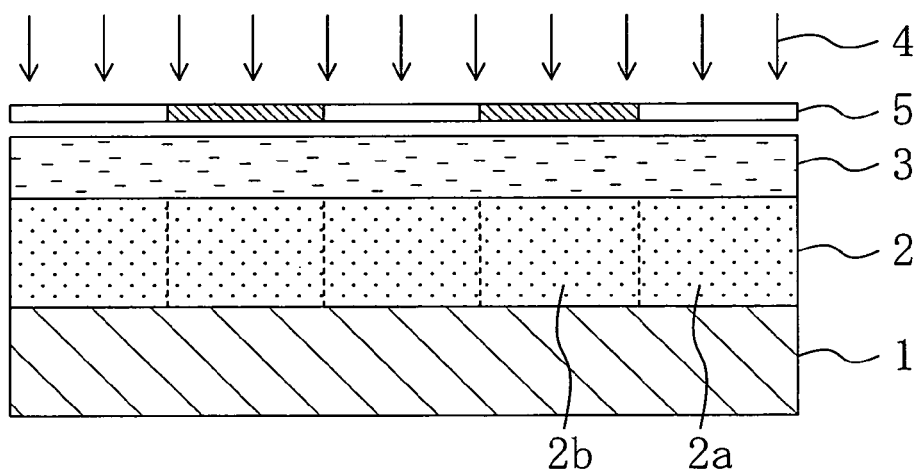
Figure 7C:
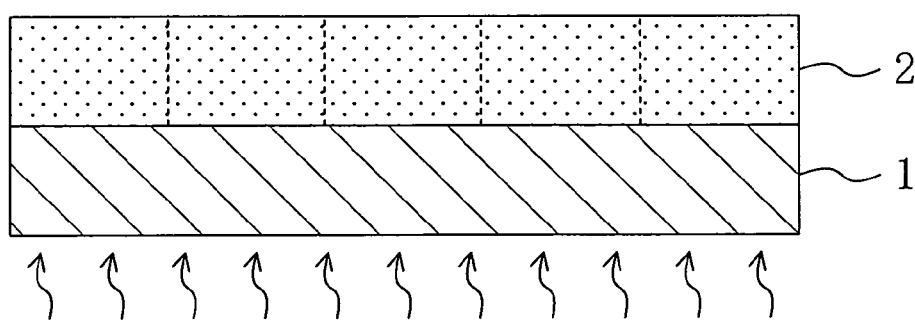
Figure 7D:
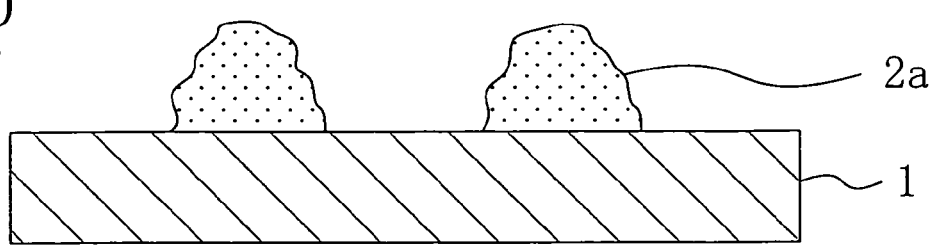

After the pattern exposure, as shown in FIG. 6C, the resist film 22 is baked with a hot plate at a temperature of 100° C. for 60 seconds, and the resultant resist film is developed with a 2.38 wt % tetramethylammonium hydroxide solution (alkaline developer). In this manner, a resist pattern 22a made of an unexposed portion of the resist film 22 and having a line width of 0.09 μm can be formed in a good shape as shown in FIG. 6D.

In this manner, according to the pattern formation method of Embodiment 3, since the immersion liquid 21C provided on the resist film 22 is discharged to be placed in a flow state during the pattern exposure, variation in the temperature distribution otherwise caused between a portion irradiated with the exposing light 33 and a portion masked from the exposing light of the immersion liquid 21C can be avoided, and therefore, the temperature of the immersion liquid 21C can be made uniform. Owing to the uniform temperature of the immersion liquid 21C, variation in the refractive index of the immersion liquid 21C can be avoided, and hence, abnormal exposure such as focus failure can be prevented. As a result, the resist pattern 22a made of the resist film 22 can be formed in a good shape.

In Embodiment 3, the immersion liquid 21C may be allowed to flow through the inlet 45a into the liquid pooling section 45 at a flow rate equivalent to or lower than a discharge rate.

Also, although a dip method is employed for supplying the immersion liquid 21C onto the resist film 22 in Embodiment 3, the bucket method employed in Embodiment 1 or a puddle method may be appropriately employed.

Furthermore, the liquid pooling section 40 of Embodiment 1 or the liquid pooling section 45 of Embodiment 3 may be provided with the stirrer 44 used in Embodiment 2.

In each embodiment, the exposing light 33 is ArF excimer laser, which does not limit the invention, and the exposing light 33 may be KrF excimer laser, $F_2$ laser, KrAr laser or $Ar_2$ laser.

Also, when vacuum UV such as $F_2$ laser is used as the exposing light, the immersion liquid is preferably perfluoropolyether.

As described so far, in the exposure system and the pattern formation method of this invention, the variation in the temperature caused in an immersion liquid during pattern exposure by light energy of exposing light can be avoided, and therefore, abnormal exposure such as focus failure of a projection lens can be prevented. As a result, a resist pattern can be formed in a good shape, and thus, the invention is useful as an exposure system and a pattern formation method employing the immersion lithography.

What is claimed is:

1. A pattern formation method comprising the steps of:
   forming a resist film on a substrate;
   performing pattern exposure by selectively irradiating said resist film with exposing light through an immersion liquid with an immersion liquid provided on only a region of resist film that is being irradiated; and
   developing said resist film after the pattern exposure,
   wherein said immersion liquid is stirred during the pattern exposure and circulated during the pattern exposure in the step of performing pattern exposure, and
   said immersion liquid is allowed to flow during the pattern exposure in the step of performing pattern exposure.

2. A pattern formation method comprising the steps of:
   forming a resist film on a substrate;
   performing pattern exposure by selectively irradiating said resist film with exposing light with an immersion liquid provided on said resist film; and
   developing said resist film after the pattern exposure,
   wherein said immersion liquid is stirred during the pattern exposure in the step of performing pattern exposure, and
   said immersion liquid is allowed to flow during the pattern exposure in the step of performing pattern exposure.

3. The pattern formation method of claim 2,
   wherein said immersion liquid is discharged during the pattern exposure in the step of performing pattern exposure.

4. The pattern formation method of claim 3,
   wherein a fresh immersion liquid is supplied onto said resist film during the pattern exposure in the step of performing pattern exposure.

5. The pattern formation method of claim 2,
   wherein said immersion liquid is water or perfluoropolyether.

6. The pattern formation method of claim 2,
   wherein said exposing light is KrF excimer laser, ArF excimer laser, $F_2$ laser, $Kr_2$ laser, ArKr laser or $Ar_2$ laser.

* * * * *